United States Patent [19]

Clemmons, Jr.

[11] 4,392,749
[45] Jul. 12, 1983

[54] INSTRUMENT FOR DETERMINING COINCIDENCE AND ELAPSE TIME BETWEEN INDEPENDENT SOURCES OF RANDOM SEQUENTIAL EVENTS

[75] Inventor: James I. Clemmons, Jr., Newport News, Va.

[73] Assignee: The United States of America as represented by the Administrator of the National Aeronautics and Space Administration, Washington, D.C.

[21] Appl. No.: 282,191

[22] Filed: Jul. 10, 1981

[51] Int. Cl.³ .................... G04F 8/00; G04B 47/00
[52] U.S. Cl. ..................... 368/118; 368/6; 368/9; 368/10; 368/119; 368/120
[58] Field of Search ............... 368/6, 9, 10, 118, 119, 368/120; 235/92 T; 328/129; 324/181, 186, 187

[56] References Cited

U.S. PATENT DOCUMENTS

| | | | |
|---|---|---|---|
| 3,532,974 | 3/1968 | Lemoine | 368/120 |
| 3,564,284 | 2/1969 | Kamens | 368/120 X |
| 3,611,134 | 10/1971 | McDowell | 324/187 |
| 3,618,089 | 11/1971 | Moran | 368/119 X |
| 3,675,127 | 7/1972 | McKiernan | 368/119 |
| 3,731,194 | 5/1973 | Favin et al. | 324/186 |
| 3,893,030 | 7/1975 | Brandenburg et al. | 324/181 |
| 3,906,346 | 9/1975 | Hunter | 324/186 |
| 4,079,315 | 3/1978 | Mohr | 324/186 |
| 4,090,133 | 5/1978 | Klyce et al. | 324/186 |
| 4,090,141 | 5/1978 | Leblanc | 328/129 |
| 4,150,333 | 4/1979 | Edwards et al. | 368/118 |
| 4,152,645 | 5/1979 | Bendler | 368/118 X |
| 4,161,691 | 7/1979 | Vermeers | 368/118 X |
| 4,162,443 | 7/1979 | Brearley et al. | 368/118 X |
| 4,164,648 | 8/1979 | Chu | 368/119 X |
| 4,165,459 | 8/1979 | Curtice | 368/119 X |
| 4,245,334 | 1/1981 | Bieramperi | 368/6 X |
| 4,268,913 | 5/1981 | Nakagiri et al. | 368/10 |
| 4,268,915 | 5/1981 | Parmet | 368/10 X |
| 4,279,028 | 7/1981 | Lowenslager et al. | 368/10 X |
| 4,290,128 | 9/1981 | Estabrook | 368/6 X |

Primary Examiner—J. V. Truhe
Assistant Examiner—Terrance Flower
Attorney, Agent, or Firm—Howard J. Osborn; John R. Manning; William H. King

[57] ABSTRACT

An instrument that receives pulses from a primary external source and one or more secondary external sources and determines when there is coincidence between the primary and one of the secondary sources. The instrument generates a finite time window (coincidence aperture) during which coincidence is defined to have occurred. The time intervals between coincidence apertures in which coincidences occur are measured.

7 Claims, 4 Drawing Figures

INSTRUMENT FOR DETERMINING COINCIDENCE AND ELAPSE TIME BETWEEN INDEPENDENT SOURCES OF RANDOM SEQUENTIAL EVENTS

ORIGIN OF THE INVENTION

The invention described herein was made by employees of the U.S. Government and may be manufactured and used by or for the Government for governmental purposes without the payment of any royalties thereon or therefor.

BACKGROUND OF THE INVENTION

The invention relates generally to laser velocimetry and more specifically concerns an instrument, useful in laser velocimetry, for determining coincidence and elapse time between independent sources of random sequential events.

A laser velocimeter, when used in wind tunnel applications, can generate large amounts of data arriving randomly at a high average rate. Advanced measurement concepts, such as vectorial flow field analysis, and turbulence power-spectral-density studies, cannot be undertaken unless additional instrumentation is used. Current methods of processing laser velocimeter data determine the velocity statistics of an independent component of the flow field. These methods do not assure the researcher that each data point is based upon multicomponent measurements of each seeding particle. However, known, coincident, multicomponent measurements of each seeding particle would permit the statistical analysis of the flow velocity vectorial quantities of magnitude and angle. The measurement of power spectral density requires time dependent data; therefore, the time interval between successive measured events must be known. In practice, the autocovariance function is determined by using the velocity data along with the interarrival time data in a Fourier transform to obtain the power spectral density.

Previous methods for determining coincidence used a data validation signal from each flow component electronic instrumentation. The coincidence test would often fail due to the different data dependent processing delays of the instrumentation, even though the flow component measurements were made from the same seeding particle. A coincidence window (aperture), as used in the present invention, permits the adjustment of the coincidence condition to allow for the difference in the processing delays. Although, it is not known whether a current measurement is of interest until coincidence is determined, the interval timing of the measurement events in any one flow component must be accurately maintained.

It is an object of this invention to provide an instrument for determining coincidence of pulses in a first source of pulses with pulses in one or more additional sources of pulses and for determining the time intervals between coincidences.

Another object of this invention is to provide an instrument for determining coincidence of pulses in a first source of pulses with pulses in one or more additional sources of pulses and for determining the time interval between the pulses in the first source in which coincidence occurred.

A further object of this invention is to provide an instrument for determining coincidence of pulses in a first source of pulses with pulses in one or more additional sources of pulses in which the interval of coincidence begins at the leading edges of the pulses in the first source of pulses and end at a predetermined time later (coincidence aperture).

Other objects and advantage of this invention will become apparent hereinafter in the specification and drawings.

SUMMARY OF THE INVENTION

The invention consists of three major components: an interarrival time measurement circuit, an interarrival time measurement control circuit, and a system control and timing sequence generator.

The interarrival time measurement circuit contains the necessary binary counters, temporary data storage, and data output circuits to generate a digital number related to the time intervals between coincidences. Coincidence is defined as occurring when a pulse from a secondary source coincides with a coincidence aperture generated by a pulse from a primary source and the time intervals measured are the time intervals between coincidence apertures in which coincidence occurs. The interarrival time measurement control circuit (the key circuit of this invention) controls how the binary counters, latches, and output circuitry function. Routine timing and control is provided by the system control and timing sequence generator.

The system control and timing sequence generator is a utility circuit that produces a series of pulses which are used to control various system functions. There is only one series of pulses produced by the sequence generator per external driving source pulse. This pulse series is fixed and is the control cycle for the circuit. The measurement cycle for the circuit consists of the control cycle and the time until the next coincident pulse is received. The pulses controlling the interarrival time circuits are: start, aperture end, and reset. A start pulse is generated immediately after the receipt of the pulse from the external source and initiates the measurement; an aperture end pulse may be any subsequent pulse in the series selected to generate the desired coincidence aperture; the reset pulse completes the control cycle. The coincidence aperture pulse is ANDed with the pulses from an additional source(s) generating a coincidence signal.

The interarrival time measurement circuit consists of two binary counters, two latches for the temporary storage of data, and the necessary output circuitry for the placing of data onto the system's output bus. The binary counters provide a method of maintaining proper interarrival time measurements as required by the dual factors of coincidence and coincidence aperture. Measurement of the interarrival time is made from the leading edges of the pulse supplied by the external driving source. Since it cannot be determined whether the current interarrival time measurement will be valid until the end of the coincidence aperture time, the binary counter making the measurement is allowed to continue to count until the reset pulse which is after the coincidence aperture. The system control and timing sequence generator start pulse, although, will store the leading edge value of the interarrival time measurement thereby saving the true pulse to pulse measurement. At the same time a second binary counter begins to measure the next interval.

The interval time measurement control circuit consists of several flip-flops that are responsive to coincidence pulses, start pulses and reset pulses for controlling the two counters.

DETAILED DESCRIPTION OF THE INVENTION

Figure 1:
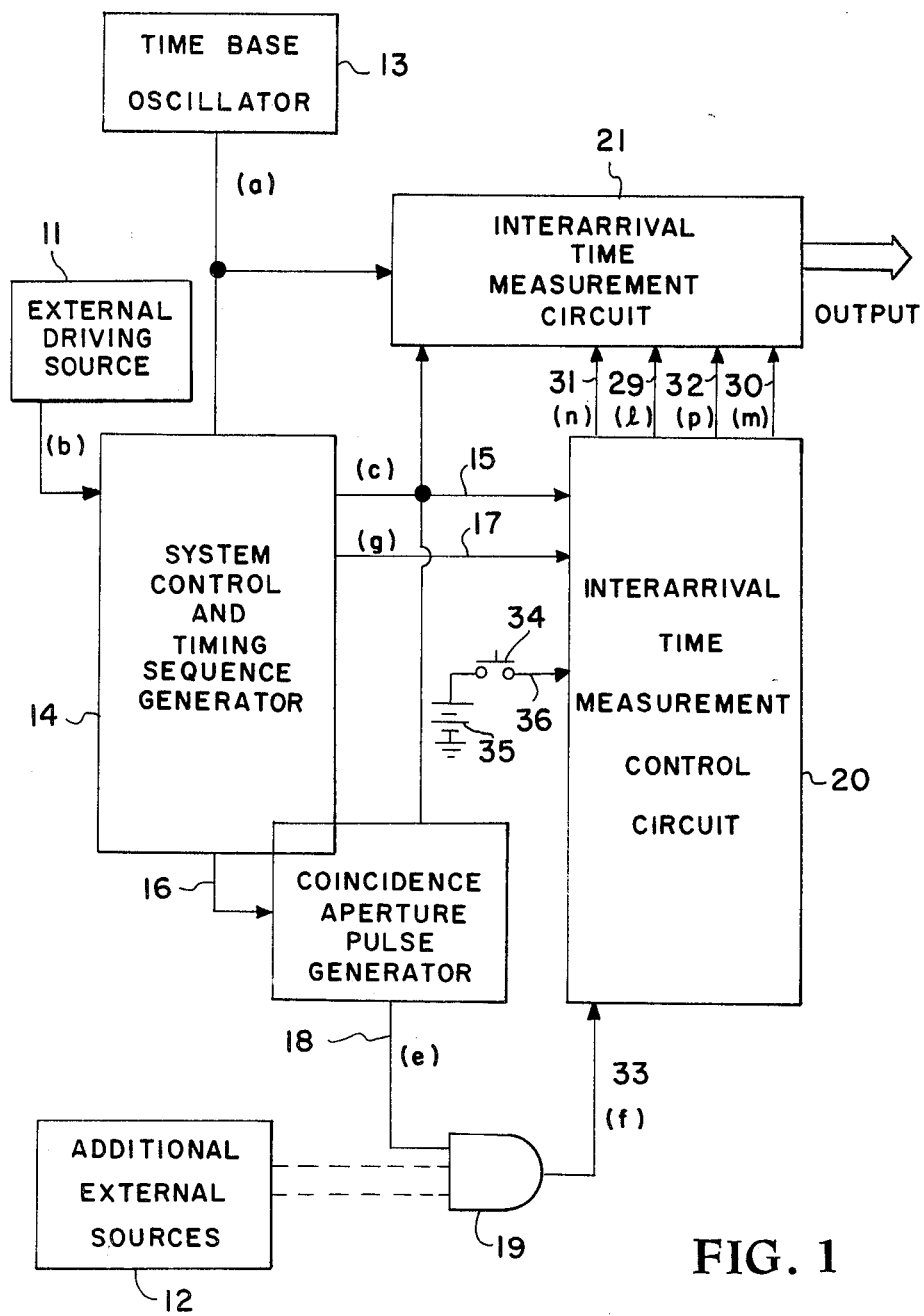
FIG. 1 is a block diagram of the invention.

Turning now to the embodiment of the invention selected for illustration in the drawings the number 11 in FIG. 1 designates an external driving source that is to be tested for coincidence with one or more additional external sources 12. FIG. 2b is representative of source 11 and FIG. 2a is representative of the output from a time base oscillator 13. Source 11 and oscillator 13 are connected to a system control and timing sequence generator 14 which generates a start pulse (FIG. 2c) on an output 15, an aperture end pulse (FIG. 2d) on output 16, and a reset pulse (FIG. 2g) on an output 17. The pulses generated by the system control and timing sequence generator 14 are used to control various system functions. There is only one series of pulses generated by the sequence generator per external driving source pulse. This pulse series is fixed and is the control cycle. The measurement cycle consists of the control cycle and the time until the next coincidence pulse is received. The start and aperture end pulses are applied to a coincidence aperture pulse generator 18 which generates the coincidence aperture pulses shown in FIG. 2e. Circuitries for performing the functions of generators 14 and 18 are well known and obvious and therefore not disclosed in detail in this specification. The coincidence aperture pulse is ANDed by means of an AND gate 19 with the pulses from source(s) 12 generating coincidence signals (FIG. 2f).

An interarrival time measurement control circuit 20 controls the measurements made by an interarrival time measurement circuit 21. The interarrival time measurement circuit 21 as shown in FIG. 3 consists of two n-bit binary counters 22 and 23, two latches 24 and 25 for the temporary storage of data from counters 22 and 23, respectively, and output control circuits 26 and 27 for placing the data in latches 24 and 25 onto an output bus 28. The output from the time base oscillator 13 is applied to the count inputs of binary counters 22 and 23. A control signal shown in FIG. 2l is applied from an output 29 of control circuit 20 to the clear input of counter 22 to inhibit the counting of that counter. A control signal shown in FIG. 2m is applied from an output 30 of control circuit 20 to the clear input of counter 23 to inhibit the counting of that counter. The start pulses on the output 15 of time sequence generator 14 are applied to the clock inputs of latches 24 and 25 which causes the latches to store the counts on the counters at the beginnings of the start pulses. The control signals shown in FIG. 2n and FIG. 2p on outputs 31 and 32 of control circuit 20 are applied to the enable inputs of output controls 26 and 27, respectively, to transfer the data in latches 24 and 25 to the output bus 28.

Figure 4:
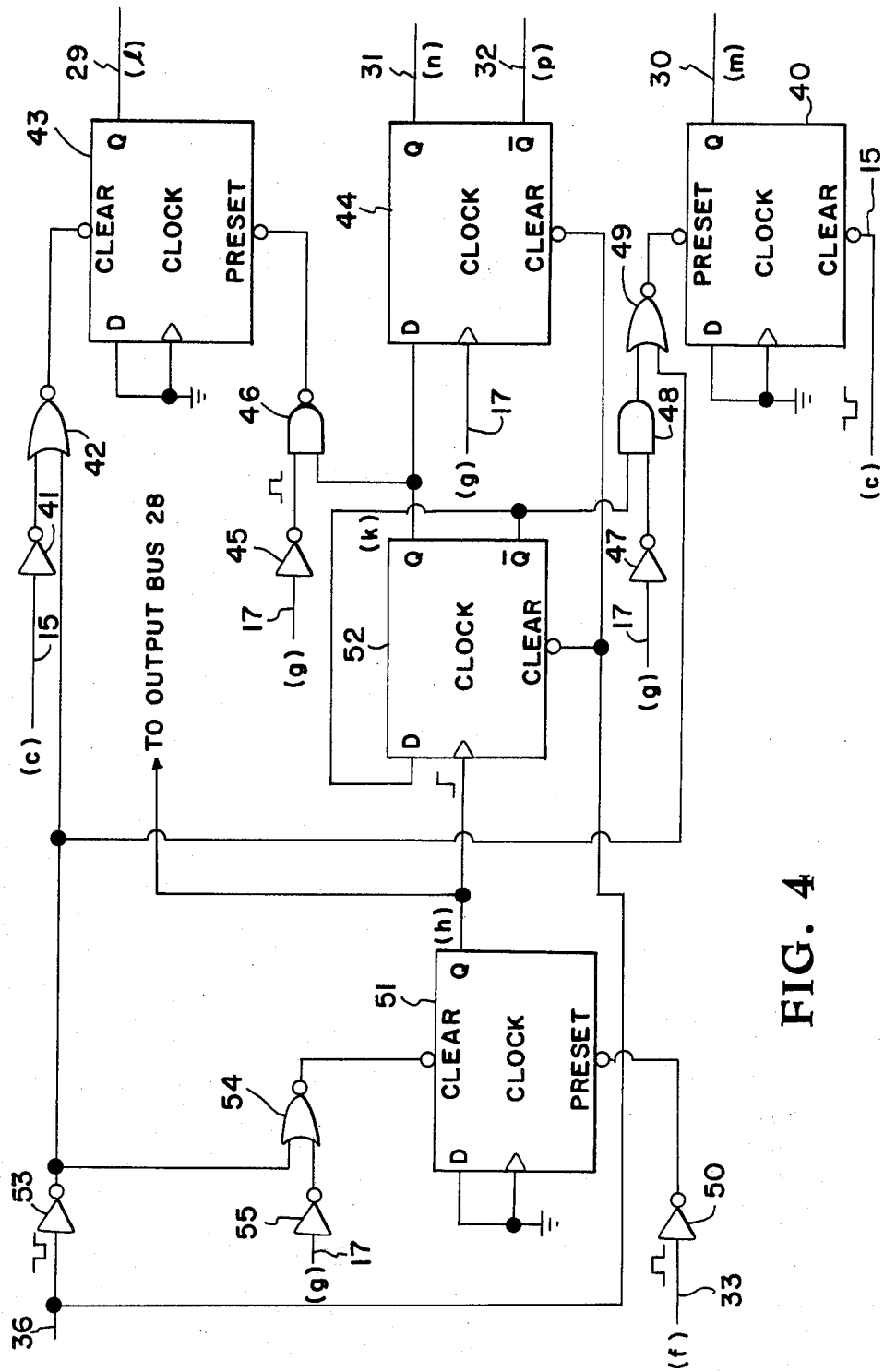
FIG. 4 is a block diagram of the interarrival time measurement control circuit.

Outputs 15 (start pulses) and 17 (reset pulses) from system control and timing sequence generator 14 and output 33 (coincidence) from AND gate 19 are applied to interarrival time measurement control circuit 20. In addition, an output 36 is applied to a control circuit 20 from an initialization circuit consisting of a switch 34 and a voltage source 35 as shown in FIG. 4. Output 15 is applied directly to the clear input of a flip-flop 40 and is also applied through an inverter 41 and a NOR gate 42 to the clear input of a flip-flop 43. Output 17 is applied directly to the clock input of a flip-flop 44, through an inverter 45 and a NAND gate 46 to the preset input of flip-flop 43 and through an inverter 47 (this inverter can obviously be eliminated) an AND gate 48 and a NOR gate 49 to the preset input of flip-flop 40. Output 33 is applied through an inverter 50 to the preset input of a flip-flop 51. Output 36 is applied to the clear inputs of flip-flop 44 and a flip-flop 52. Output 36 is also applied through an inverter 53 to gate 42, to gate 49 and through a NOR gate 54 to the clear input of flip-flop 51. The reset pulse is inverted by an inverter 55 and then applied to gate 54. The data and clock inputs of flip-flops 40, 43 and 51 are connected to ground. The Q output of flip-flop 51 is connected to the clock input of flip-flop 52. The Q output of flip-flop 52 is connected to gate 46 and to the data input D of flip-flop 44. The $\bar{Q}$ output of flip-flop 52 is connected to gate 48 and to the data input D of flip-flop 52. The preset inputs of flip-flops 44 and 52 are connected to a constant voltage. The Q output of flip-flop 43, the Q output of flip-flop 40 and the Q and $\bar{Q}$ outputs of flip-flop 44 are the inputs 29, 30, 31 and 32 to interarrival time measuring circuit 21. All flip-flops are D type in which on the leading edge of a clock input the Q output follows the data input. That is, Q equals D at the leading edge of clock signal. When a flip-flop is preset Q equals "1" and $\bar{Q}$ equals "0" and when a flip-flop is cleared Q equals "0" and $\bar{Q}$ equals "1".

Figure 2:
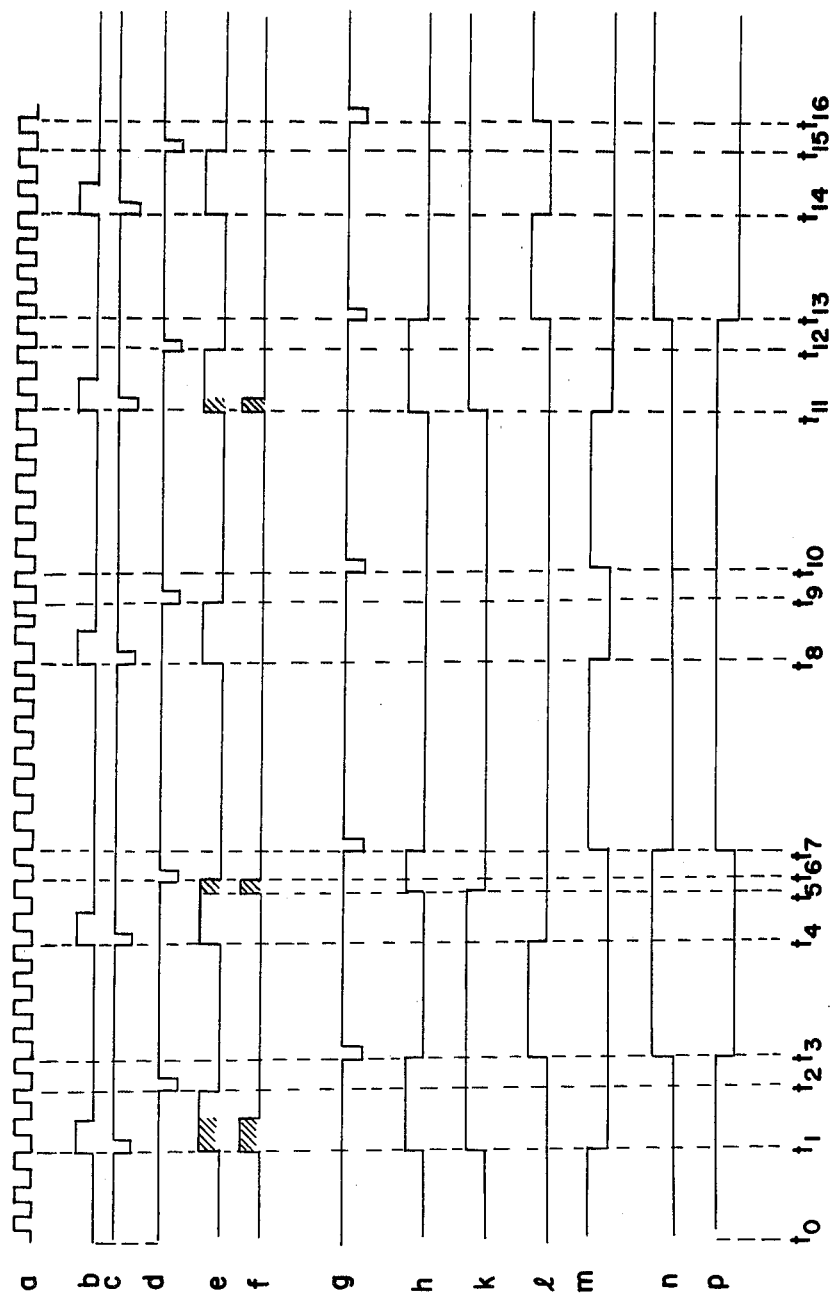
FIG. 2 is a timing diagram for explaining the operation of the invention.
Figure 3:
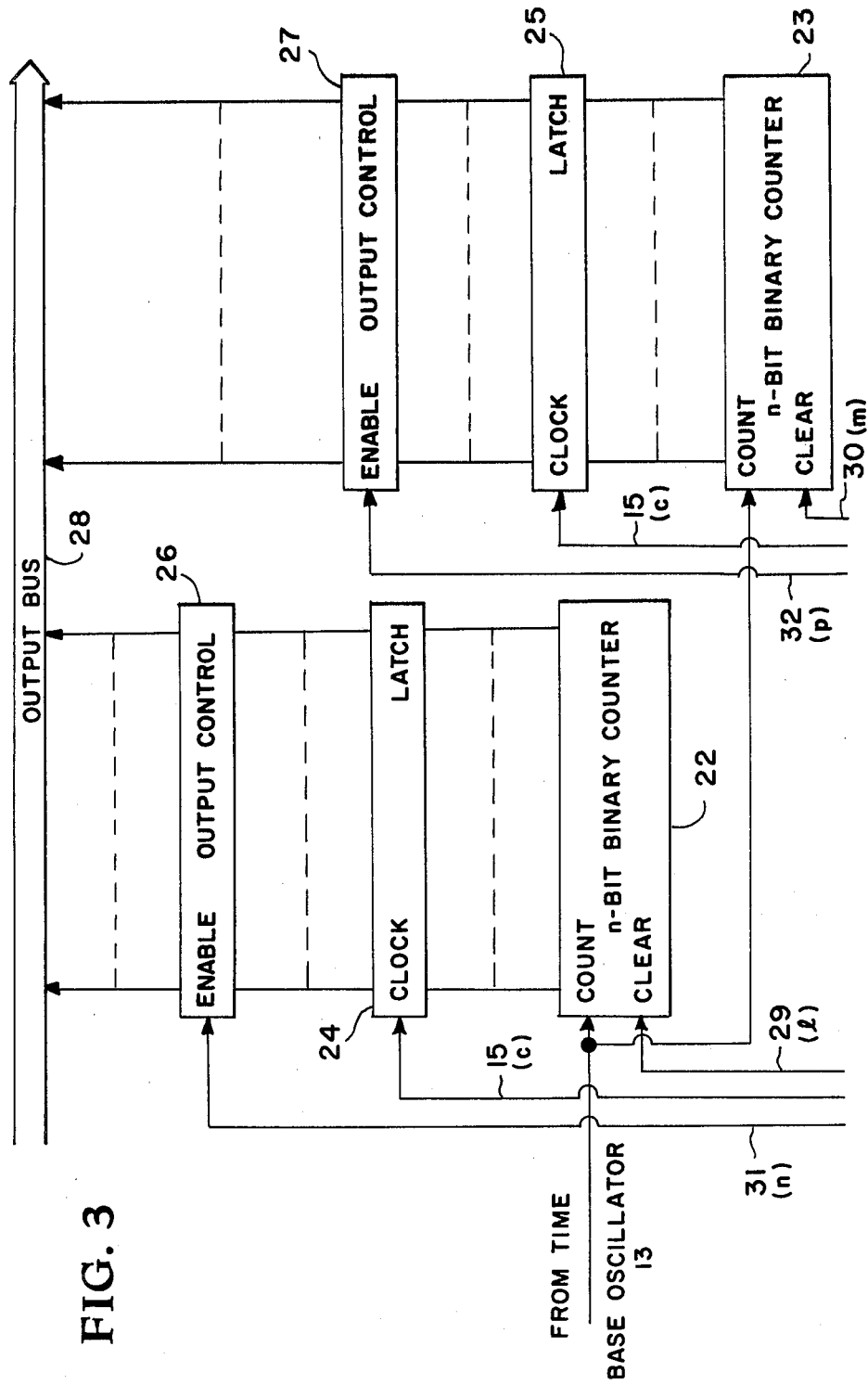
FIG. 3 is a block diagram of the interarrival time measurement circuit.

In describing the operation of this invention, the letters in parenthesis refer to the timing diagram in FIG. 2. To start operation at $t_o$ switch 34 is pushed. The resulting pulse clears flip-flops 43, 44, 51 and 52, and presets flip-flop 40. Hence the "0" on output 29 (l) allows counter 22 to count, the "1" on output 30 (m) inhibits counter 23. At time $t_1$ source 11 produces a pulse (b) which causes system control and timing sequence generator 14 to generate a start pulse (c), an aperture end pulse (d) at $t_2$, a coincidence aperture (e) which begins at $t_1$ and ends at $t_2$, and a reset pulse (g) at $t_3$. As can be seen from FIG. 2 coincidence occurred (sources 12 produced a pulse during the coincidence aperture) producing a coincidence pulse (f) beginning at $t_1$. Consequently at $t_1$ the Q output of flip-flop 51 (h) changes from a "0" to a "1" causing the Q output of flip-flop 52 (k) to change from a "0" to a "1". The start pulse applied to flip-flop 40 causes its Q output (m) to change from a "1" to a "0". This allows counter 23 to start counting and the start pulse (c) applied to latch 24 stores the count on counter 22 in latch 24 at time $t_1$. At the time of the reset pulse (g), $t_3$, the Q output of flip-flop 51 is changed from a "1" to a "0", the Q output of flip-flop 43 is changed from a "0" to a "1", and the Q output of flip-flop 44 is changed from a "0" to a "1".

When the next source 11 pulse (b) occurs at time $t_4$ the start, aperture end, coincidence aperture and reset pulses are generated as before. In this case, coincidence occurred at a time $t_5$ which is after $t_4$. At time $t_4$ the start pulse applied to flip-flop 43 causes its Q output to change from "1" to "0" thereby allowing counter 22 to start to count. At the same time the start pulse applied to latch 25 causes the count on counter 23 to be dumped into latch 25 and then counter 23 continues to count. At time $t_5$ when coincidence occurs the Q output of flip-flop 51 changes to a "1" indicating that the data stored by latch 25 is valid and is therefore indicative of the time between the source 11 pulses (b) in which there was coincidence with pulses from sources 12. At time $t_3$ the Q output of flip-flop 44 changes from a "1" to a "0" thereby enabling output control 27 to place the count stored in latch 25 at $t_4$ to be placed on the output bus 28.

When the next source 11 pulse occurs at time $t_8$ there is no coincidence. Hence the Q output of flip-flop 51 does not change to a "1" to indicate that the data stored by one of the latches is valid. Also, the Q output of flip-flop 44 does not change. When the next, source 11 pulse occurs at time $t_{11}$, there is coincidence. Hence, the coincidence pulse (f) causes the Q output of flip-flop 51 to change to a "1" indicating that the count on counter 22 at time $t_{11}$ and stored in latch 24 is valid. That is this count proportional to the difference between time $t_{11}$ and time $t_4$ which is the time between coincidences. Note that at time $t_7$ counter 23 was reset because its data was valid and again at time $t_{10}$ it was reset because there was no coincidence. At time $t_{13}$ counter 22 is reset because its data is valid and again it is reset at $t_{16}$ because there is no coincidence.

The above discussion demonstrates that the binary counters 22 and 23 provide a method of maintaining proper interarrival time measurements as required by the dual factors of coincidence and coincidence aperture. Measurement of the interarrival time is made from the leading edges of the pulse supplied by the external driving source 11. Since it cannot be determined whether the current interarrival time measurement will be valid until the end of the coincidence aperture time, the binary counter making the measurement is allowed to continue to count until a reset pulse (g) occurs which is after the coincidence aperture. The system control and timing sequence generator 14 signal on output 15 (c) in FIG. 2, although, will store the leading edge value of the interarrival time measurement thereby saving the true pulse to pulse measurement. At the same time a second binary counter begins to measure the next interval.

If coincidence occurs the counter that made the last measurement reset to zero to await the receipt of a new input pulse. The second counter already making a measurement of the current interval continues to do so. Had coincidence not occurred then the first counter would have been allowed to continue its measurement while the second counter would have been reset.

The output of the interarrival time binary counters is the number of cycles of the time base signal (a) that occurred during the measured interval. The real time interval must be determined by computational circuitry, or by the period (resolution) of the time base.

The interarrival time measurement control circuit 20 maintains valid interarrival time measurements based upon the coincidence of two or more external events. The coincidence signal, the product of the coincidence AND gate 19, presets the coincidence flip-flop 51 in the control circuit. The output of the concidence flip-flop controls the coincidence steering flip-flop 52 which directs reset pulses to the binary counter that will be halted as the result of coincidence.

The counter inhibit controls of the binary counters are maintained by the control flip-flops 43 and 40. As an example of their operation, assume that counter 23 is inhibited (Q="1") and that counter 22 is counting (Q="0"). Since counter 22 was counting control flip-flop 43 output Q="0" the start pulse has no effect and it continues to count. Counter 23, although, is started since the start pulse cleared flip-flop 40 (Q="0"). If coincidence occurs then the coincidence steering flip-flop 52 routes the reset pulse to control flip-flop 43, presetting the flip-flop, and resetting counter 22 to zero. If coincidence did not occur then the reset pulse is routed to control flip-flop 40 and counter 23 is reset to zero, while counter 22 would continue to count.

The output control flip-flop 44 enables the output circuits (FIG. 3) to place the interarrival time onto the system's output bus 28. This data, latched at a start pulse, is the data from the interarrival counter that made the most recent measurement. Since the data is placed on the output bus prior to the determination of coincidence the output of the coincidence flip-flop 51 should be used as a data validation signal. If the data is to be stored into a memory generally the interarrival time for each input pulse is written into memory regardless of whether concidence occurred. In this case the output of the coincidence flip-flop may be used as a memory address increment control.

The initialization signal sets up the control circuit for proper operation, but it also allows a special feature. Initialization will clear control flip-flop 43 starting interarrival time counter 22, but initialization presets flip-flop 40 inhibiting the operation of counter 23. The first interval measured therefore will be from initialization to the first coincidence condition.

The advantage of this invention is that it maintains accurate elapse time measurements between two pulses from one external pulse source even though true coincidence (overlap of pulses from two or more sources) may not occur as coincidence is determined via a predetermined coincidence window.

What is claimed is:

1. An instrument for determining coincidence between a primary external source of pulses and one or more other external sources of pulses comprising:
   means receiving said primary external source of pulses for generating a start pulse, a reset pulse and a coincidence aperture pulse each time a primary external source pulse is received;
   means receiving said coincidence aperture pulse and the pulses from said other external sources of pulses for producing a coincidence pulse each time a pulse from said other external sources of pulses coincides with said coincidence aperture pulse; and
   means receiving said start pulses, said reset pulses and said coincidence pulses for measuring the time intervals between coincidences.

2. An instrument according to claim 1 wherein said means for generating a start pulse, a reset pulse and a coincidence aperture pulse includes a time base oscillator for generating a constant frequency pulse source.

3. An instrument according to claim 2 wherein said start and said coincidence aperture pulse begin at the time of the primary external source pulse and said reset pulse occurs after the end of said coincidence aperture pulse.

4. An instrument according to claim 3 wherein said means for measuring the time intervals between coincidences comprises first and second counters connected to said time base oscillator and means receiving said start pulses, reset pulses and coincidence pulses for controlling said first and second counters such that they alternate in providing counts of the constant frequency pulse source between the start pulses in which there are coincidences during the corresponding aperture pulses.

5. An instrument according to claim 4 wherein said means for controlling said first and second counters includes means for activating the counter that was not counting upon the receipt of a start pulse and means for inactivating and resetting the counter that started counting the last time there was coincidence upon the receipt of a coincidence pulse and a reset pulse and for inactivating resetting the other counter upon the receipt of a reset pulse without a coincidence pulse.

6. An instrument according to claim 5 wherein said means for controlling said first and second counters includes means for temporarily storing the count on the counter that was counting upon the receipt of a start pulse.

7. An instrument according to claim 6 wherein said means for controlling said first and second counters includes means responsive to said coincidence pulses for indicating whether or not the temporarily stored pulses are valid.

* * * * *